United States Patent

Ishii

[15] 3,662,234

[45] May 9, 1972

[54] SEMICONDUCTOR ELECTROMECHANICAL TRANSDUCER ELEMENT HAVING A P-N-P OR N-P-N AMPLIFYING JUNCTION INTEGRALLY ASSOCIATED WITH A STRAIN-SENSITIVE REGION

[72] Inventor: Katsuyuki Ishii, Nagoya, Japan

[73] Assignee: Kabushiki Kaisha Toyota Chuo Kenkyusho, Aichi-ken, Japan

[22] Filed: Oct. 30, 1970

[21] Appl. No.: 85,414

[30] Foreign Application Priority Data

Nov. 13, 1969 Japan....................................44/90981

[52] U.S. Cl.....................317/235 R, 317/234 R, 317/235 M, 317/235 Y, 317/235 AA, 307/308, 73/88.5

[51] Int. Cl.......................................H01l 11/00, H01l 15/00

[58] Field of Search................317/234, 235, 22, 22.11, 22.1, 317/29, 26; 73/88.5, 141; 179/100.41, 110, 121; 307/308

[56] References Cited

UNITED STATES PATENTS

| | | | |
|---|---|---|---|
| 3,270,554 | 9/1966 | Pfann | 73/88.5 |
| 3,337,780 | 8/1967 | Robbins | 317/235 |
| 3,454,845 | 7/1969 | Sikorski | 317/235 |
| 3,492,513 | 1/1970 | Hollander et al. | 317/235 |
| 3,492,861 | 2/1970 | Jund | 73/88.5 |

*Primary Examiner*—John W. Huckert
*Assistant Examiner*—Andrew J. James
*Attorney*—Oblon, Fisher & Spivak

[57] ABSTRACT

A highly sensitive, stable output, electromechanical semiconductor transducer element is formed from a unitary body of a semiconductor material wherein three regions are formed to provide a strain-sensitive region and P-N junctions which can provide a high gain electrical output which is based on a piezoresistive effect produced in the strain-sensitive region which is amplified by the presence of P-N junctions.

7 Claims, 19 Drawing Figures

INVENTOR
KATSUYUKI ISHII

BY Oblon, Fisher & Spivak
ATTORNEYS

SEMICONDUCTOR ELECTROMECHANICAL TRANSDUCER ELEMENT HAVING A P-N-P OR N-P-N AMPLIFYING JUNCTION INTEGRALLY ASSOCIATED WITH A STRAIN-SENSITIVE REGION

BACKGROUND OF THE INVENTION

1. Field of the Invention

The present invention generally relates to a high sensitivity electromechanical semiconductor transducer element which utilizes a piezoresistive effect.

2. Description of the Prior Art

Heretofore, pressure-sensitive transistors or semiconductor type strain gauges have been used as electromechanical semiconductor transducer elements. In the state of the art pressure-sensitive transistors, however, the output gain was based on the effect of stress on the characteristics of a P-N junction situated between the base and the emitter, upon the application of a local load. Generally speaking, the sensitivity of those devices was very low, especially when the load caused a stress of less than an order of magnitude of $1 \times 10^4$kg/cm$^2$. Accordingly, in order to detect mechanical forces when a small load was applied, it was necessary to apply a larger load to the transistor as a tare load so as to bring the device up to a condition of high sensitivity. The load to be measured was then superimposed over the tare weight. This technique, however, has led to frequent device failures caused by overloading of the element.

The state of the art semiconductor type strain gauges have also proven to be unsatisfactory in certain circumstances. These devices provide an output which is proportional to the magnitude of the load. The output decreases, however, as the magnitude of the load decreases, so that an amplifier is required for the measurement of very small loads.

SUMMARY OF THE INVENTION

Accordingly, it is one object of the present invention to provide a high sensitivity electromechanical transducer element which is capable of providing a stable output.

Another object of the present invention is to provide an electromechanical semiconductor transducer element which can provide a high gain electrical output which is based on a piezoresistive effect, wherein the output is amplified by using the amplification effect of a P-N-P or N-P-N junction, formed within the semiconductor.

These and other objects have now herein been attained by providing a strain-sensitive transistor type semiconductor element which is highly sensitive in comparison with prior art pressure-sensitive transistors or prior art semiconductor type strain gauges, even when the load applied is very small.

In the present invention, a first region of one conductivity and a second region of opposite conductivity, e.g., a P-type region and an N-type region are formed in a semiconductor crystal. A third region of the same conductivity as the first region is partially formed within the second region. The second region is a strain sensitive region and the output gain of the device can be obtained by the resistance variation occurring in the second region when a mechanical load is applied to the element. The resistance between that portion of the second region which is opposed to the third region and the electrode of the second region is adjusted so that it is larger than the resistance of the P-N junction between the second region and the third region. By using this configuration, the P-N-P or the N-P-N junction can be used to amplify the output of the second region so as to provide the electromechanical semiconductor transducer element of high sensitivity and a stable output.

In one embodiment of this invention, the second region is formed into a slender, elongated or belt-like shape, which is arranged in the crystal in a straight or zig-zag type configuration. When a zig-zag configuration is used, portions of the elongated second region can be formed approximately parallel to the direction of the compression or tension of the element when a load is applied, and portions of the second region can be formed approximately perpendicular to the direction of the compression or tension. By using this zig-zag configuration, the resistance of that portion of the second region which is approximately parallel to the direction of the compression or tension will be smaller than the resistance of that portion of the second region which is perpendicular to the direction of the compression or tension. The piezoresistive effect in the parallel direction is thus smaller than that in the perpendicular direction, so that strain in the perpendicular direction can be easily detected.

BRIEF DESCRIPTION OF THE DRAWINGS

A more complete appreciation of the invention will be attained by reference to the accompanying drawings, wherein:

FIG. 1 shows a sectional view of a semiconductor crystal wafer;

FIG. 2 shows a sectional view of the wafer formed with an oxide coating thereon;

FIG. 3 shows a plane view of an organic film formed on the surface of the wafer;

FIG. 4 shows a sectional view of the wafer formed with a second region;

FIG. 4 shows a sectional view of the wafer a long the V—V line of FIG. 4;

FIG. 6 shows a sectional view of the wafer formed with a third region;

FIG. 7 shows a sectional view of the completed element;

FIG. 8 shows a sectional view of the completed element along the VIII—VIII line of FIG. 7;

DETAILED DESCRIPTION OF PREFERRED EMBODIMENTS

An N-type Si single crystal was used as the material to form the first region. Boron atoms were diffused into a portion of the crystal in order to form a P-type second region. Phosphorus atoms were then diffused into a portion of the second region to form a third region. The three types of elements, hereinafter designated as A, B and C and having the configurations as shown in FIGS. 7–8, 9–10, and 11, respectively, can be prepared according to the present invention and can be used for strain-gauge applications in the measurement of the relationship between the mechanical load and the output or current-variation.

Figure 7:
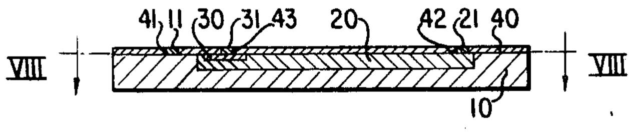
Figure 8:
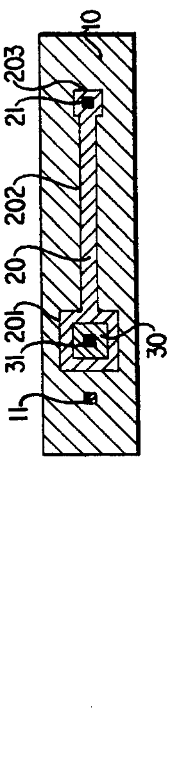

Element A is shown in FIGS. 7 and 8 and consists of a first region 10 and a second region 20, which is formed in the surface of the first region 10. The second region consists of a base portion 201, an elongated or belt-shaped portion 202 and a top portion 203. Portions 202 and 203 shall hereinafter together be referred to as the gauge portion. A third region 30 is formed in the base portion 201. A first electrode 11 is connected to the first region, a second electrode 21 is connected to the top portion 203 of the second region, and a third electrode 31 is connected to the third region, respectively. The electrodes are connected by means of apertures 41, 42 and 43, which pass through the oxide film ($SiO_2$) 40, at the surface of the element, permit connection directly to the semiconductor regions. Leads (not shown) are then connected to the electrodes.

Figure 1:
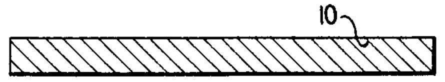
FIG. 1 to FIG. 8 show the process of producing one embodiment of the present invention, and in more detail.

In producing an A-type element, an N-type Si single crystal 10 of 0.9 Ω-cm of resistivity is used, as shown in FIG. 1. This crystal is obtainable by slicing a semiconductor crystal and polish etching it to a mirror finish. The <111> direction of the crystal was taken as the longitudinal direction of the wafer, the <110> direction as the width direction and the <211> direction as the thickness direction in order to maximize the piezoresistive effect in the second region.

Figure 2:
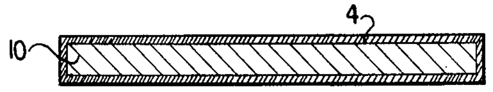
Figure 3:
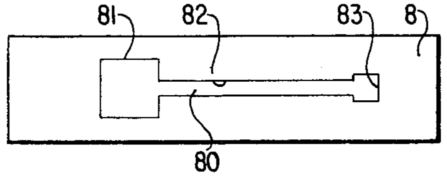

The wafer was then held at a temperature of 1,100° C. for 60 minutes under a saturated water vapor atmosphere at 100° C. in order to form a silicon dioxide film on the surface of the wafer, as shown in FIG. 2. An acid-resistant organic film 8 was formed over the silicon dioxide layer using conventional resist techniques to form aperture 80 which comprises a base portion 81, an elongated or belt-like portion 82 and a top portion 83, as shown in FIG. 3. The wafer was then immersed in an acid bath containing $NH_4F$ as its main constituent in order to dissolve the exposed silicon dioxide film and to form aperture 45 corresponding to aperture 80 in the organic film. The remaining organic film 8 was then removed.

Figure 4:
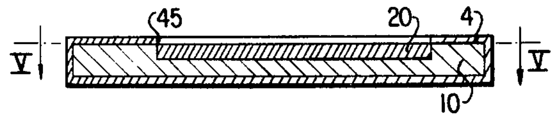
Figure 5:
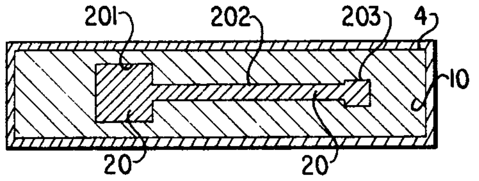
Figure 6:
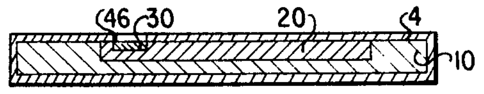

A mixed gas of nitrogen and oxygen was then passed over a heated $B_2O_3$ source material at a temperature of 1,200° C. and the wafer was immersed in an atmosphere of the mixed gas. After 30 minutes at a temperature of 1,200° C., boron was diffused through aperture 45 into the wafer. As shown in FIGS. 4 and 5, the boron diffusion creates a second region 20, which includes a square-shaped base portion 201 and a gauge portion comprising an elongated or belt-shaped portion 202, and a top portion 203, at the upper side of the silicon wafer 10.

A silicon dioxide film was then reformed over the entire surface of the wafer and an approximately square-shaped region 46 of silicon dioxide 4 was etched out at the upper surface and in the central portion of the base portion 201, using an appropriate organic resist material. The resist was then dissolved away, and the apertured wafer was placed into a mixed gas atmosphere of nitrogen and oxygen, which had been passed over a $P_2O_5$ material heated at 250° C. The wafer was maintained in the mixed gas atmosphere for approximately 30 minutes at a temperature of 1,100° C. in order to diffuse phosphorous through the square-shaped diffusion region 46 and into the wafer to form third region 30 within the second region 20. The wafer was then immersed in an HF solution bath to remove the remaining silicon dioxide layer 4. A fresh layer of silicon dioxide film 40 was then formed over the top surface of the wafer by similar methods to those described above. This results in a structure as shown in FIG. 7.

Electrode apertures 41, 42 and 43, as shown in FIG. 7, were formed by partially eliminating the silicon dioxide film 40 on the upper surface of the wafer at the central portion of the third region 30, at the top of portion 203 of the second region 20, and at the end portion of the remaining Si crystal, first region 10. Aluminum is evaporated over the surface of the wafer to a thickness of about $0.5 \times 10^{-3}$ mm at a temperature of 250° C. and at a pressure of $1 \times 10^{-5}$ mm.Hg. The electrodes were then formed by depositing an organic resist over the aluminum film and then etching away all of the aluminum except within the apertured regions 41, 42 and 43, to form electrodes 11, 21, and 31 as shown in FIGS. 7 and 8. The aluminum electrodes were then ohmically connected to gold leads (not shown).

A size for element A is about 8 mm. in length, 2.5 mm. in width and 0.16 mm. in thickness.

Figure 9:
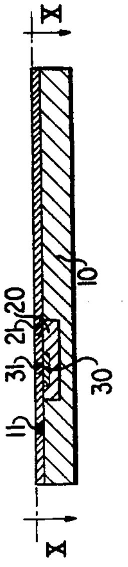
FIG. 9 shows a sectional view of another embodiment of this invention.
Figure 10:
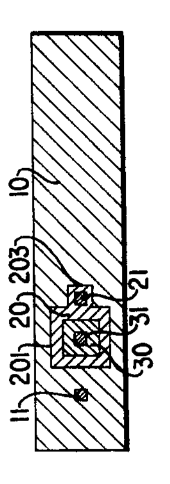
FIG. 10 shows a sectional view along the X—X line of FIG. 9.

Element B, shown in FIGS. 9 and 10, is produced in the same manner as described in forming Element A, except that the top portion 203 of the boron diffused second region 10 is formed in adjacent proximity to the base portion 201. The elongated, or belt-shaped portion 202 is thus eliminated in Element B.

Figure 11:
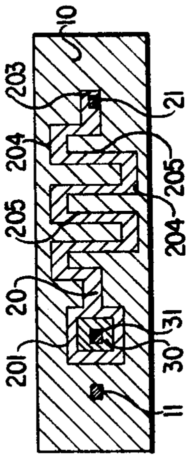
FIG. 11 shows a sectional view of still another element prepared according to the present invention.

Element C, as shown in FIG. 11, is also formed in a similar manner as Element A, except that the elongated or belt-shaped portion 202 of region 20 is replaced with a zig-zag configuration portion 204 and 205. Portion 204 of this region is parallel to the <111> direction of the crystal axis in the longitudinal direction, and portion 205 is formed parallel to the <110> direction, i.e., perpendicular to the <111> direction. The parallel section 204 is wider and shorter than the perpendicular section 205.

Each of the Elements A, B and C are similar to each other, except that the elongated or belt-shaped portion 202 is long and straight in Element A, is zig-zag in Element C, and is non-existent in Element B. Accordingly, the position of the second electrode 21 will be different depending upon the particular configuration of the second region 20.

Figure 16:
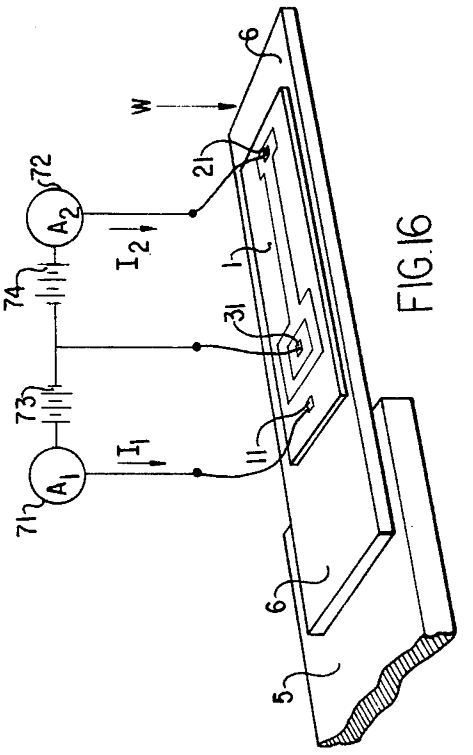
FIGS. 16 and 17, respectively, show the exemplary circuits for measuring the relationship between load and current-variation.

Various loads were applied to elements of the A, B and C types and the output currents (current-variation) corresponding to the various loads were measured. Measurements were made by use of a measuring circuit as shown in FIG. 16. In this arrangement, wafer 1 is affixed to a load plate 6 of elastic material, one end of which is affixed to a base plate 5.

The first electrode 11 of wafer 1 and the second electrode 21 on wafer 1 were respectively connected with leads to a first ammeter 71 and to a second ammeter 72. The terminals of a constant voltage source 73 were connected to the first ammeter 71 and to a second voltage source 74 which in turn was connected to a second ammeter 72 and to the third electrode 31 on wafer 1. Strain was produced in load plate 6 by the application of a load W to the load plate 6 at its free end. The indicative values of the ammeter 71 were measured both at constant voltage and at constant current. The relationship between the load and the current variation was then calculated. The tensile stress was applied in a longitudinal direction of the wafer 1 and the magnitude of the stress was found to be about $1.5 \times 10^2$ kg/cm² per gram of load. The input resistance of the first ammeter 71 was 1 Ω, and that of the second ammeter 72 was 10 Ω.

When using a constant voltage source for the second source 74, the current value $I_2$, as shown by ammeter 72, was 0.15 mA. When no load was applied, the voltage $V_1$ of the first source 73 was 7 V. The no load current value $I_{10}$, as shown by the first ammeter 71, was 10.5 mA. for each of the A, B and C elements, and the voltage $V_2$ of second source 74 was 4.35 V for Element A, 0.71 V for Element B, and 4.50 V for Element C.

Next, a variable load increasing to 10 gm. in increments of one gram, was applied to the free end of the load plate 6. The current value $I_{1W}$ as shown by the first ammeter 71 corresponding to each applied load, was measured and then the current variation $\Delta I_1$(mA) (e.g.$\Delta I_1 = I_{1W} - I_{10}$) was calculated at the various loads.

Figure 12:
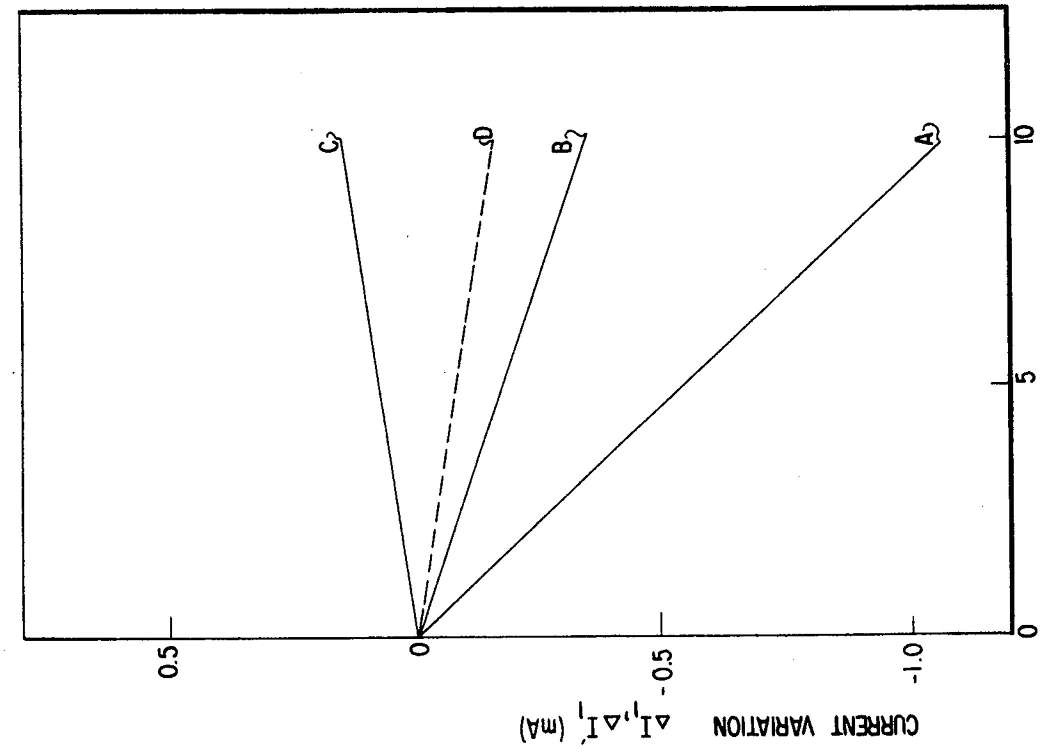
FIGS. 12–14 are graphs showing the relationship between the load and the current-variation.

The results of these tests with Elements A, B and C are shown in the graph of FIG. 12 on which solid lines A, B and C have been plotted on a scale in which abscissa is the load W (in grams), and the ordinate is the current variation $\Delta I_1$(mA).

Next, when using a constant current source for the second source 74, the current value $I'_2$, as shown by ammeter 72, was 0.15 mA. When no load was applied, the voltage value $V_1$ of the first source 73 was 7 V. The current value $I'_{10}$ as shown by the first ammeter 71 was found to be 10.5 mA for each of the elements A, B and C. That is, the current value $I'_{10}$ is equal to $I_{10}$.

Next, each current value $I'_{1W}$ of the ammeter 71 corresponding to each applied load was measured as described above, and the current variation $\Delta I'_1$ $(=I'_{1W} - I'_{10})$ was calculated.

The values of the said current variation $\Delta I'_1$ was found to be the same regardless of which of the three elements were used. These results are shown in the graph of FIG. 12, as dotted line D.

The resistance between the third electrode and the second electrode of the respective elements was found to be about 29 KΩ for Element A, about 4.7 KΩfor Element B, and about 30 KΩ for Element C.

As shown from the solid lines A, B and C in FIG. 12, a distinct relationship between a load W and the current variation $\Delta I_1$ can be observed with respect to each element. With Elements A and B, the current variations $\Delta I_1$ decrease as the load increases, whereas with Element C, the current variation $\Delta I_1$ increases as the load increases.

In the two types of measurements using a constant voltage source or a constant current source, the voltage of the first source 73 was constant (7 V) and the current value $\Delta I_{10}$ as shown by the first ammeter 71 under no load conditions, was 10.5 mA. The current variations $\Delta I_1$ of Elements A, B and C, measured at constant voltage with load, however, varied as shown by the solid lines A, B or C in the graph of FIG. 12. On the other hand, the current variation $\Delta I'_1$, as measured under constant current conditions, was approximately the same for each Element A, B and C, as shown by line D.

Since it was found that the current variation varied for each of the A, B and C elements, when a constant voltage was applied, but remained the same for each element when a constant current source was applied, it is believed that the current variation in the second region was cancelled when a constant current source was used as the second source 74, so that the current variation based on the electrical characteristics of the second region could not be detected. Thus, the current variations when a constant voltage was applied, which are different with each respective element, are dependent upon the differences in electrical characteristics of the second region of each of the respective elements. Since each of the respective elements differ only in the shape of the second region, however, it can be considered that the differences in current variation is based on the differences in shape of the respective second regions.

As can be seen from the above descriptions, the current value $\Delta i = \Delta I_1 - \Delta I'_1$ is based on the piezoresistive properties of the second region. On the other hand, the current variation $\Delta I'_1$ obtained by constant current source measurement, is based primarily on the electrical characteristics of the other regions, namely, upon the effect of stress on the P-N junction between the second and third region.

Figure 13:
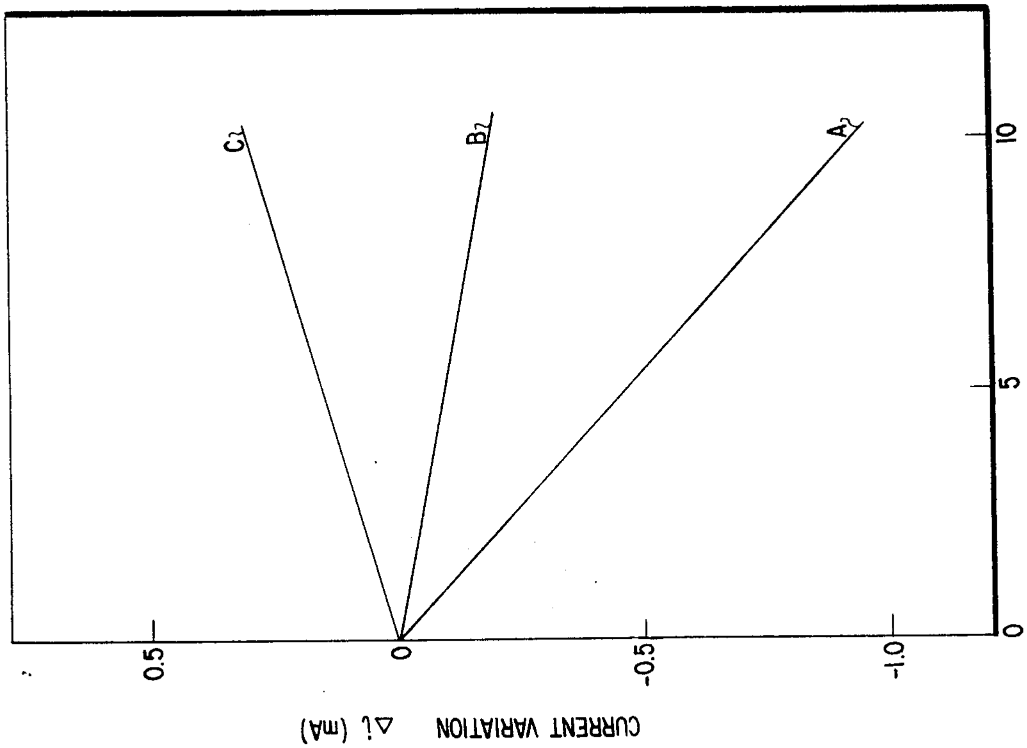

The relationship between the current variation $\Delta i = \Delta I_1 - \Delta I'_1$ (mA) and the load W is shown in the graph of FIG. 13, wherein solid lines A, B and C refer to results obtained with the respective Elements A, B and C. In this graph, the abscissa is the load W in grams, and the ordinate is the current variation $\Delta I$.

It can be seen from FIG. 13 that the ratio of the current variation relative to load is dependent upon the particular shape of the elongated or belt-shaped portion 202 of second region 20. Comparing Element A with Element B, it can be seen that the resistivity of the second region 20 of each element is the same, as is the resistance variation values per unit length based on the piezoresistive effect. However, the elongated or belt-shaped portion 202 of Element A is longer than Element B so that the resistance of the entire second region of Element A is larger than that of Element B. The resistance variation of Element A is also larger than that of Element B, even if equal loads are applied to each element. The current variation of Element A is larger than that of Element B.

Comparing Element A with Element C, it can be seen that as the load W increases, the current decreases for Element A, whereas for Element C, as the load W increases, the current increases.

As described above, the second region of Element A is formed along the longitudinal direction of the wafer, but is formed in a zig-zag configuration in Element C. The elongated or belt-shaped portion 204 in the longitudinal direction is larger in width and shorter in length than that portion 205 in the perpendicular direction. When a load is applied to the element by the methods described above, a tensile strain occurs in the longitudinal direction of the wafer and a compressive strain occurs in the perpendicular direction of the wafer. These strains would account for the decreases and increases of current in Elements A and C, respectively. That is, in Element A, the current decreases because of the increased resistance in the second region due to the tensile strain occurring in the longitudinal direction. In the case of Element C, due to the shape of the elongated or belt-shaped configuration, the resistance increases due to the tensile strain in the longitudinal direction of the wafer, while resistance of portion 205 decreases by the compressive strain. The shapes of portions 204 and 205 are each different, as described above, so that the resistance variation in the perpendicular direction of the wafer is greater in the longitudinal direction, which results in a decrease in the entire resistance of the second region. The current increases, therefore, as the applied load increases.

The conventional semiconductor type strain gauge usually consists of only that portion which corresponds to the second region of the present invention. By using the second regions of Elements A and C in the same manner as in conventional strain gauges, the relationships between loads and current variations can be easily measured in a manner similar to the measurements described above.

Figure 17:
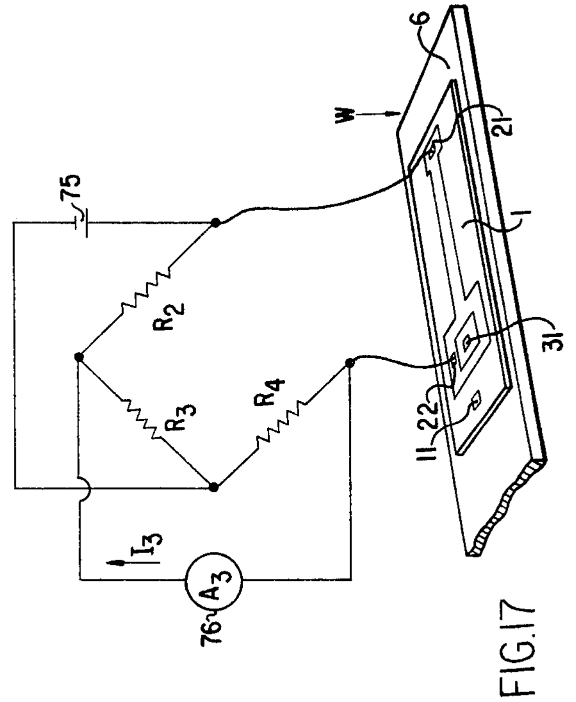

A measuring circuit for accomplishing this purpose is shown in FIG. 17. It should be noted that this circuit does not contain an amplifier. This circuit comprises a bridge circuit including a source 75, an ammeter 76 and fixed resistance $R_2$, $R_3$ and $R_4$. A wafer 1 of the element is mounted onto a load plate 6 in the same manner as described above. An electrode 22 of the element is provided on the second region in the width direction of electrode 31. Electrodes 21 and 22 of the element are attached to the bridge circuit so that only the second region of the element of the invention is effective. When Element A is used in this arrangement, it will be referred to as gauge A'. Likewise, when Element C is used in this arrangement, it will be referred to as gauge C'. Using gauge A', the no-load current between the electrodes 21 and 22 is set at 0.15 mA. Each of the resistances $R_2$, $R_3$ and $R_4$ is 24.3 KΩ, which is equal to that between electrodes 21 and 22 without load. The voltage of source 75 is approximately 7.3 V. When gauge C' is used, the current is similarly 0.15 mA., each of the resistances $R_2$, $R_3$ and $R_4$ is 25.3 KΩ and the resistance between electrodes 21 and 22 is 25.3 KΩ. The voltage of source 75 is about 7.6 V. Current variation $\Delta I_3$ (mA) of the ammeter 76 was measured as the load W was applied.

Figure 14:
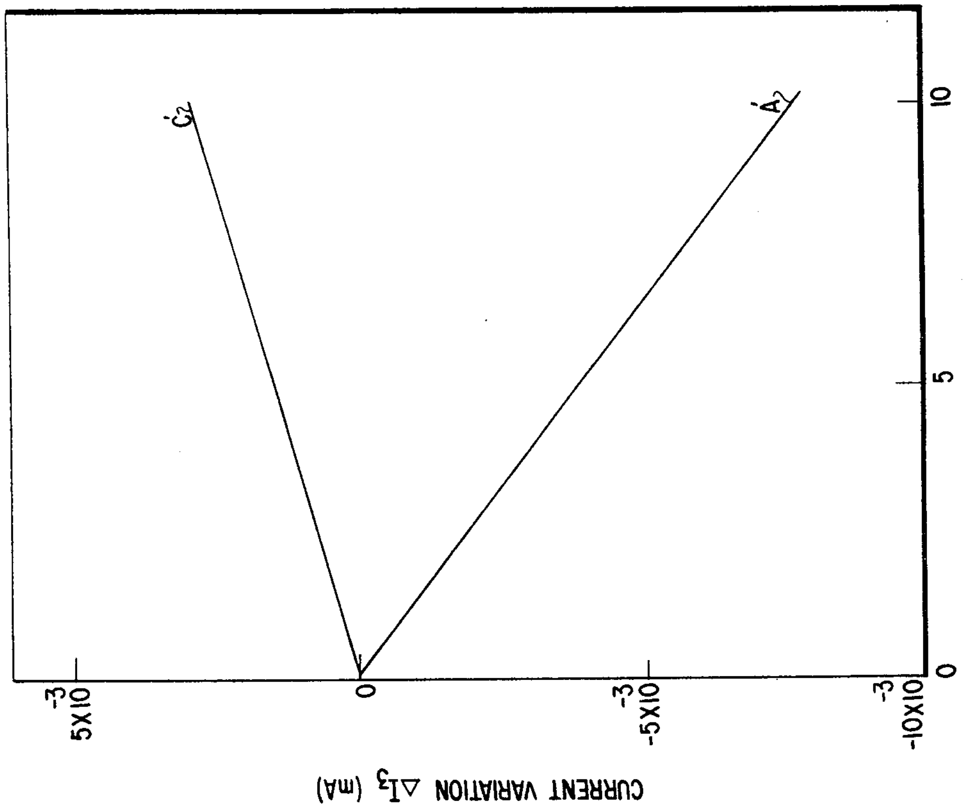

The result of these measurements is shown in the graph of FIG. 14 wherein lines A' and C' correspond to the measurements obtained when using gauges A' and C', respectively. The abscissa is the load W in grams and the ordinate is the current variation $\Delta I_3$ (mA).

As can be seen from FIG. 14, when gauge A' is tested, the current variation $\Delta I_3$ is very small. For instance, it is about $-7.8 \times 10^{-3}$ mA when the applied load is 10 g. This differs from the case of Element A in accordance with the present invention, wherein the current variation $\Delta I_1$ is very large. For instance, it was found to be about −1.1 mA, as shown in the graph of FIG. 12.

Figure 15:
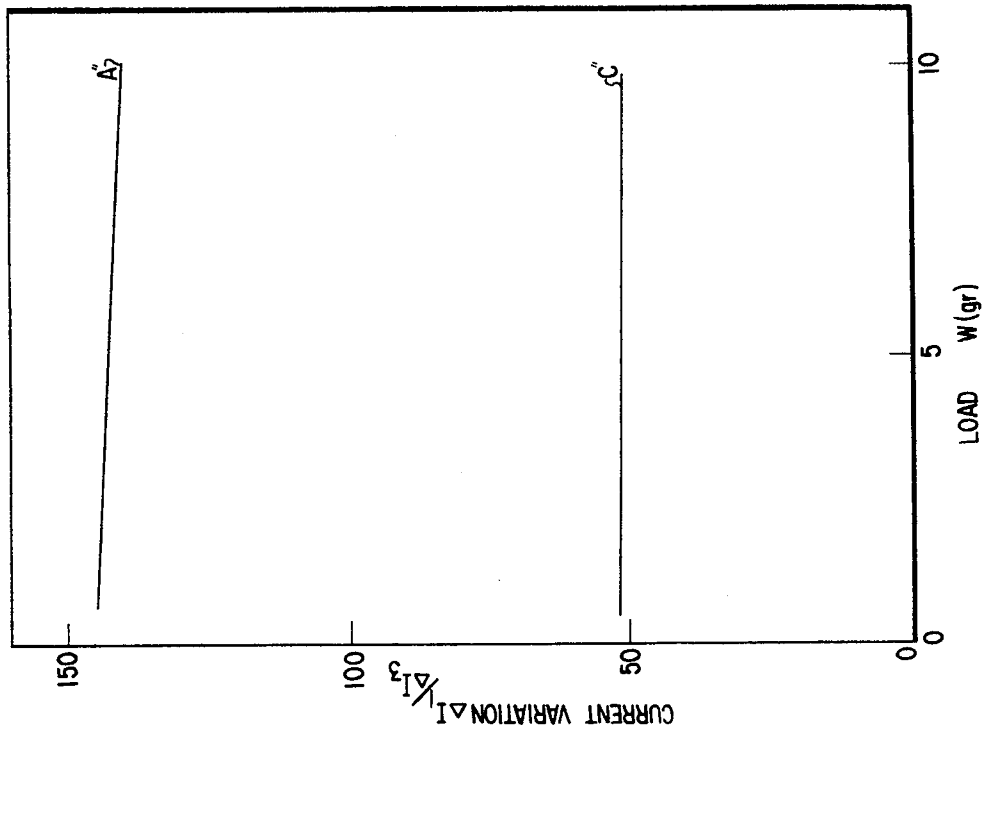
FIG. 15 shows the ratio of the load and the current-variation.

The graph of FIG. 15 indicates the ratios of the current variation $\Delta I_1/\Delta I_3$ between the current variation of said gauge A' (C') and that of the said Element A (C). The results were shown by lines A'' and C'' which correspond to the Elements A and C. The abscissa represents the load W (grams) and the ordinate represents the ratio of current variation. As can be seen from the graph of FIG. 15, Elements A and C in accordance with the present invention can provide an output of higher sensitivity than that of the conventional gauges A' and C', which consist of only the second regions and do not use amplification effect, e.g., as much as 140 times higher in the case of Element A and about 50 times higher in the case of Element C.

As described above, the elements of the present invention can be used as strain gauges which are characterized by very high sensitivity when the applied load is very small, e.g., where the stress is about $2 \times 10^2$ kg/cm². This can be explained according to the following theory: the portion between the second region nearest the third region and the second electrode act together as a strain gauge by means of electromechanical conversion based on a piezoresistive effect.

The N-P-N or P-N-P junction consisting of the first, second and third regions, act as current amplifiers of the electrical output. In other words, the elements of the present invention provide in a single body a strain gauge portion and an amplifier portion. In the case of Elements A and B, the current variation based upon the effect of stress upon the P-N junction between the second and third region is added to the electrical output.

In accordance with the present invention, the second region of the semiconductor element is formed within the first region and the third region is formed within the second region. A P-N junction occurs in each boundary of the respective regions. The first, the second and the third regions may be either N-P-N or P-N-P type. The output of the element is greatest when the piezoresistive effect of the second region is greatest, so that the crystal direction of the element must be carefully considered in forming the second region. Consideration must also be given to the conductivity type of the second region and the type of crystal (i.e., Si or Ge) to be used for the element.

Figure 18:
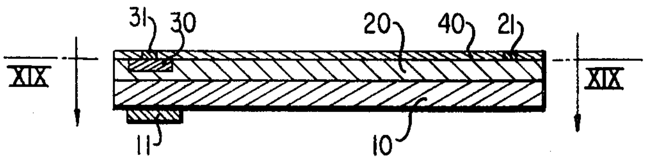
FIG. 18 shows a sectional view of another embodiment of this invention.
Figure 19:
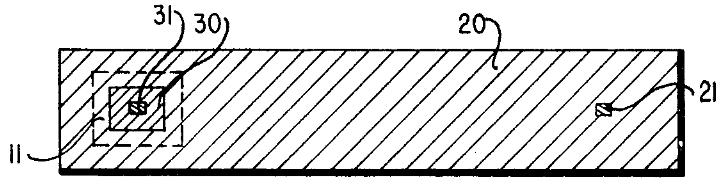
FIG. 19 shows a sectional view along the XIX—XIX line of FIG. 18.

The shape of each region is not limited to the particular disclosed embodiments and it may be formed in a variety of shapes such as straight shaped or zig-zag in the longitudinal direction of the wafer, or straight shaped or zig-zag at a direction to some angle to the longitudinal direction. The element may be formed in a double layered configuration as shown in FIGS. 18 and 19 wherein the second region 20 constitutes a top layer over the entire surface of the wafer. In this instance, the second electrode 21 can be provided at one end of the upper surface of the wafer with the third region 30 being provided at the opposite end of said surface. The first electrode 11 can be located at the lower surface of the wafer, and the third electrode 31 can be provided in the third region 30.

The current variation when strain is produced in the element is larger when the resistance of the second region is larger. In the embodiment of the present invention, a base portion 201 and a top portion 203 were provided and a slim, belt-shaped portion 202 was provided between the two end portions of the second region. The belt-shaped portion 202 may be formed such that it is a little wider in the width in order that the third region and the second electrode can be formed on opposite ends of the belt-shaped portion.

It has been ascertained that when the electrical resistance between the second region portion immediately adjacent to the third region and the second electrode is larger than that of the P-N junction between the second and third region, the efficiency of the piezoresistive effect of the second region is very large, and the output obtained from the element is very large, so that the unique advantages of the present invention are obtained.

The resistance value of the second region can be measured between the second electrode and the electrode 22 (FIG. 17) of the second region. The said P-N junction resistance can be measured between the electrode 22 of the second region and the third electrode, by applying a voltage across the P-N junction, and by making a current flow from the P-type region to the N-type region. The applied voltage across the P-N junction can be between 0.5 to approximately 1.5 V.

The elements of the present invention can be used not only by being affixed to a load plate to be measured, but also can be used alone, for example, in the condition of a cantilever.

The elements of the present invention can be used as most effective strain gauges, but they can also be used as pressure-sensitive elements which convert mechanical energy to electrical energy, such as in a pickup mechanism for a recording operation.

In summary, the electromechanical semiconductor transducer element of the present invention can be prepared from a wide variety of semiconductor materials such as Si, Ge, GaAs. These elements contain a first region and a second region, the conductivities of which are different each from the other. These elements contain also a third region, which is partially formed in the second region and which is characterized by the same conductivity type as that of the first region. Electrodes having connecting leads are provided for each region.

Essential to the present invention is the fact that the resistance between the portion of the second region, which is in adjacent proximity to the third region, and the electrode of the second region, be larger that the resistance across the P-N junction, between the second region and the third region. According to the present invention, the second region acts as an electromechanical transducer element due to a piezoresistive effect and the P-N-P or N-P-N junctions act as an amplifier of the electrical output obtained from said second region. Accordingly, a highly sensitive element can be obtained even under small load conditions. Because of this high sensitivity, the current passing through the element can be minimized and only a small amount of Joule's heat will be caused by the passage of the current and the temperature of the element will not rise. The output of the device is relatively stable and it is not necessary to provide a special amplifying circuit.

When the portion of the element between the second electrode of the second region and the third region is shaped into a narrow, belt-shaped configuration, the resistance of the second region will increase and the sensitivity of the element will also correspondingly increase. Strain can easily be detected if the following conditions are present. The second region should be shaped in a zig-zag configuration wherein portions of the region are approximately parallel to the direction of tensile strain when a load is applied, and portions of the region are approximately perpendicular to this direction. The resistance of that portion of the second region which is parallel to the direction of the strain should be smaller than that in the perpendicular direction. The resistance-variation based on the piezoresistive effect in that portion of the second region, which is parallel to the direction of the strain, should be smaller than that in the perpendicular direction. The electrode of the second region should be formed at one end of the second region and the third region should be formed at the opposite end.

Having now fully described the invention, it will be apparent to one of ordinary skill in the art that many changes and modifications can be made thereto without departing from the spirit or scope of the invention. Accordingly,

What is claimed and intended to be covered by Letters Patent of the United States is:

1. An electromechanical semiconductor transducer element which comprises:

a semiconductor base material forming a first region of a first conductivity having an electrode attached thereto, a second region formed in said first region being characterized by a different type conductivity from that of said first region, said second region being composed of a base portion and a gauge portion integrally formed in said base portion and having an electrode attached to an end of said gauge opposite said base portion, and, a third region of like conductivity as said first region and being formed in the base portion of said second region and having an electrode attached thereto, wherein the resistance of said gauge portion between the base portion and the electrode of the second region, is larger than the resistance across the P-N junction formed between the second region and the third region.

2. The electromechanical semiconductor transducer element of claim 1, wherein said gauge portion is composed of a slender, elongated portion which extends over substantially the entire length of the first region, and a top portion formed at an end opposite to said base portion, and wherein the electrode for the second region is attached to said top portion.

3. The electromechanical semiconductor transducer element of claim 1, wherein said gauge portion is composed of a zig-zag shaped portion formed integrally within said first region, including sections which are parallel to the direction of tensile strain in said element, when a load is applied, and including sections which are perpendicular to the direction of said tensile strain.

4. The electromechanical semiconductor transducer element of claim 1, wherein said semiconductor base material is a single crystal material selected from the group consisting of Si, Ge, and Ga As.

5. The electromechanical semiconductor transducer element of claim 1, wherein said second region is formed over the entire upper surface of said first region and wherein the second electrode is provided on the upper surface and at one end portion of said second region, said third electrode is provided on said third region, and said first electrode is provided on the lower surface of said first region.

6. The electromechanical semiconductor transducer element of claim 1, wherein said first region comprises a region of N-type conductivity, said second region comprises a region of P-type conductivity, and said third region comprises a region of N-type conductivity.

7. The electromechanical semiconductor transducer element of claim 1, wherein said first region comprises a region of P-type conductivity, said second region comprises a region of N-type conductivity, and said third region comprises a region of P-type conductivity.

* * * * *